United States Patent [19]
Lecinski

[11] Patent Number: 5,922,997
[45] Date of Patent: Jul. 13, 1999

[54] APPARATUS AND METHOD FOR ROUTING CABLES

[75] Inventor: Daniel J. Lecinski, Buffalo Grove, Ill.

[73] Assignee: 3Com Corp., Rolling Meadows, Ill.

[21] Appl. No.: 08/851,186

[22] Filed: May 5, 1997

[51] Int. Cl.$^6$ .................................................. H01B 7/00
[52] U.S. Cl. ........................ 174/135; 248/65; 379/327; 385/134
[58] Field of Search ..................... 174/135, 64, 65 R, 174/68.1, 60, 69, 71 R, 72 R, 72 A; 361/525, 526, 527, 528; 248/65; 379/326, 327, 329; 385/134, 135, 136

[56] References Cited

U.S. PATENT DOCUMENTS

| | | | |
|---|---|---|---|
| 2,292,140 | 8/1942 | Lofgren | 24/130 |
| 3,499,097 | 3/1970 | Widstrand | 174/65 A |
| 4,174,911 | 11/1979 | Maccario et al. | 403/303 |
| 4,431,152 | 2/1984 | Reed, Jr. | 248/65 |
| 4,516,874 | 5/1985 | Yang et al. | 403/313 |
| 5,267,710 | 12/1993 | Condon | 248/65 |

*Primary Examiner*—Kristine Kincaid
*Assistant Examiner*—Dhiru R Patel
*Attorney, Agent, or Firm*—Brinks Hofer Gilson & Lione

[57] ABSTRACT

An apparatus for routing cable includes a slide member slidably attached to a mounting member. The mounting member may be attached to a module and/or rack. The slide member includes a cable opening for receiving one or more cables. The slide member may include symmetrical arm portions which border the cable opening to allow the mounting member to be attached to either side of a module or rack. The mounting member may include a module mounting portion at a right angle to a rack mounting portion. The slide member may include a slot with a rivet positioned therein to allow the slide member to extend to an open position and retract to a closed position.

13 Claims, 2 Drawing Sheets

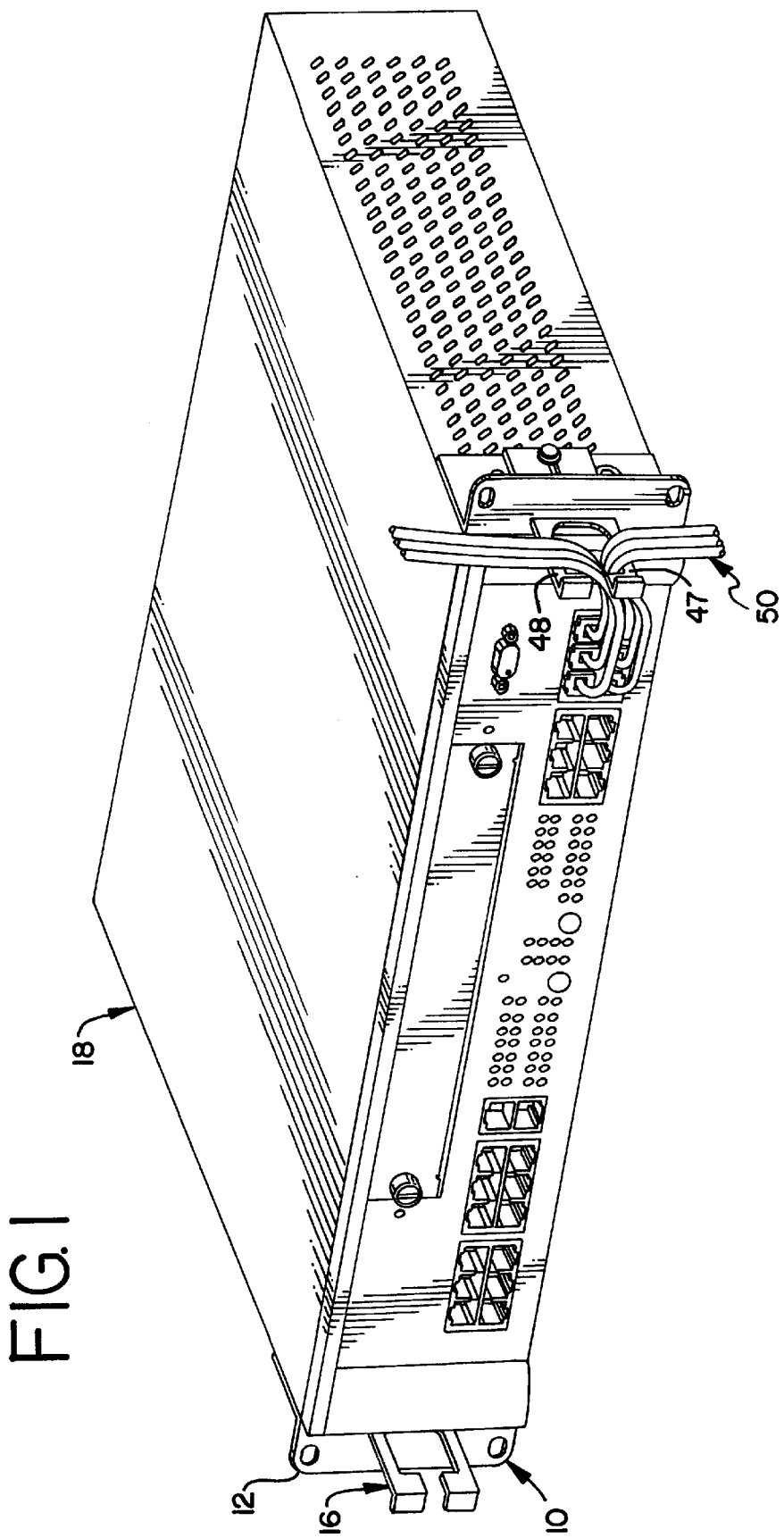

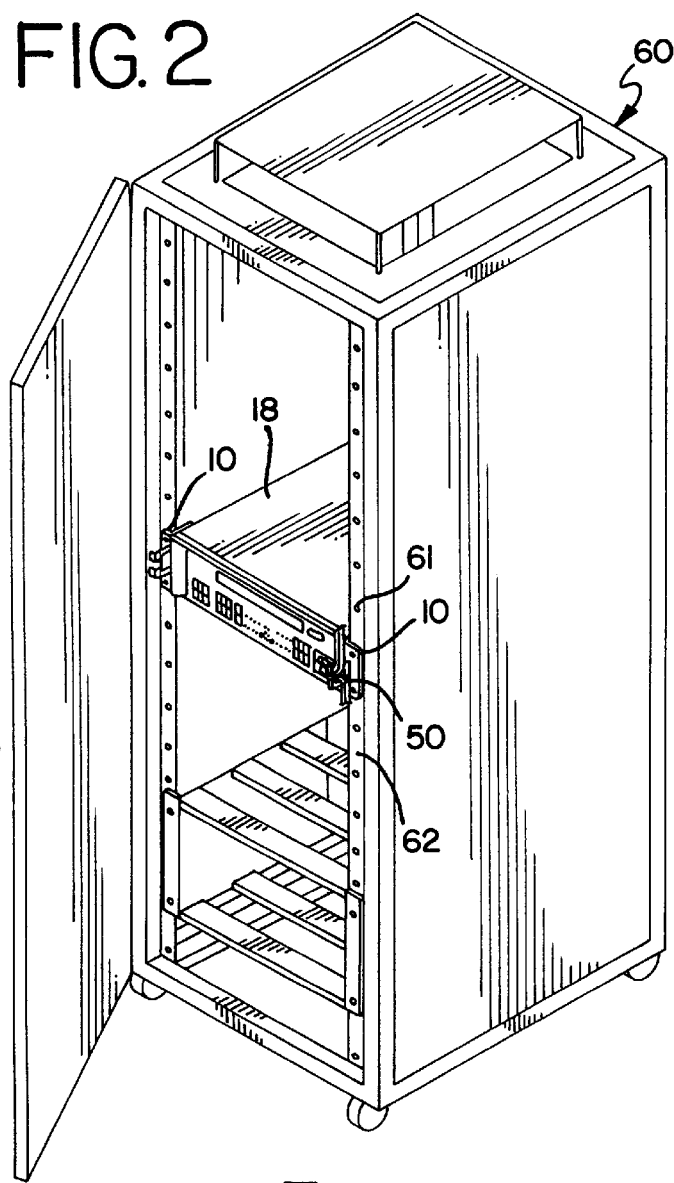
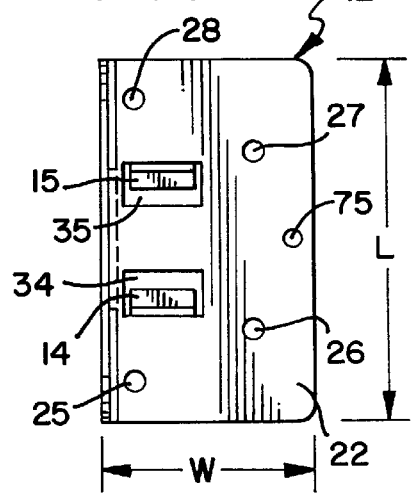
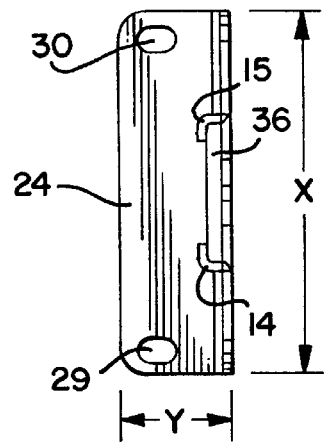
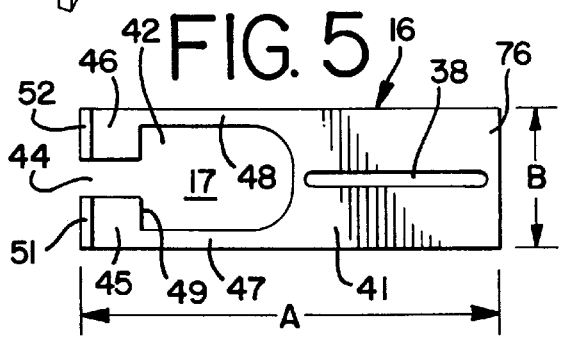
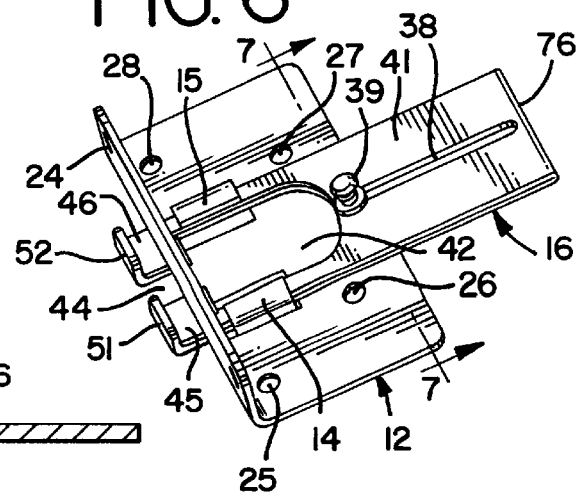
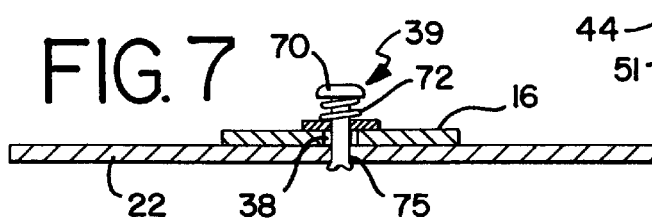

5,922,997

APPARATUS AND METHOD FOR ROUTING CABLES

FIELD OF THE INVENTION

The invention generally relates to an improved cable routing apparatus and method for routing cables. More specifically, the invention relates to a cable routing apparatus which may be attached to an electronic module rack and/or module to route cables upward or downward along the rack.

BACKGROUND OF THE INVENTION

Electronic modules, including for example, switching and routing modules, are often inserted in standardized racks. These racks have upright supports with spaced openings. Brackets and conventional fasteners are used to secure the modules to the upright supports. Normally, these brackets have fastener openings which align with the upright supports and with openings on the sides of the module adjacent its front face.

Various cable routing devices are used to route cables to and along the upright supports of the rack. In general, these devices are attached to the upright supports or module. Cables connected to ports in the front face of the modules may be routed through the cable routing devices, which are typically mounted upon the face or sides of the modules and/or to the upright support frames of the rack. These cable routing devices are designed in varying configurations including hooks, and clasps which receive and route the cables upward or downward along the upright support frame, or horizontally along the face of the module. In general, these devices are fixed in position with a screw or other conventional fastener.

One problem with these existing cable routing devices is that they require the user to install a separate device for the purpose of routing cables. In addition, these devices typically extend outward from the face of the module, which may clutter the front face of the module. Moreover, physical removal of the cable routing device may become necessary, in some instances, when the routing device is not in use.

It would be desirable to have a cable management device which could avoid these problems, and provide a simple cost effective cable routing solution.

SUMMARY OF THE INVENTION

One aspect of the invention provides an apparatus for routing cable including a mounting member including at least one retaining member for slidably receiving a slide member. The slide member is slidably attached to the mounting member. The slide member includes a cable opening formed therein for retaining cables. The slide member may include a body portion, and at least one arm portion. Preferably, two arm portions are provided which border the cable opening. The body portion of the slide member may preferably include a slot formed therein, and a rivet is fitted through the slot, slidably attaching the slide member to the mounting member. The mounting member may include an opening formed therein for receiving the slide member. The mounting member may include two retaining members, each of which are formed from a portion of the mounting member.

Another aspect of the invention provides an apparatus for routing cable including a mounting member including a rack mounting portion and a module mounting portion. The rack mounting portion includes an opening formed therein for receiving a slide member. The slide member is slidably attached to the module mounting portion. The slide member includes a cable opening formed therein for receiving and retaining cables. The rack mounting portion may preferably be oriented at substantially a right angle to the module mounting portion. The slide member may include a body portion and at least one arm portion. The body portion of the slide member may preferably include a slot formed therein for receiving a rivet to allow the slide member to slide to an open position and to a closed position. The slide member may include two arm portions. The arm portions may preferably be symmetrical to allow the apparatus to be mounted on either side of a module or rack. The slide member may include an end portion on each of the arm portions. The inward side of the end portions may retain cables positioned between the arm portions. Hook portions may preferably extend at an angle to the end portions for allowing the slide member to be easily grasped and slid to the desired position. The cable opening preferably includes a cable insertion opening and a cable retaining opening. The cable insertion opening may be bordered by end portions of the slide member. The cable opening may be bordered by two arm portions of the slide member. The arm portions may be made of a flexible material to allow a user to flex the arm portions to insert cables into the cable opening.

Another aspect of the invention provides a method of operating cable routing apparatus. A slide member slidably attached to a mounting member is provided. The slide member includes a cable opening formed therein. The mounting member is attached to a module. The slide member is slid to an open position. One or more cables which are attached to the module are positioned in the cable opening. The mounting member may be mounted to a rack. The cables may be routed upward or downward along an upright support frame of the rack.

The invention provides the foregoing and other features and advantages of the invention will become further apparent from the following detailed description of the presently preferred embodiments, read in conjunction with the accompanying drawings. The detailed description and drawings are merely illustrative of the invention rather than limiting, the scope of the invention being defined by the appended claims and equivalents thereof.

BRIEF DESCRIPTION OF THE DRAWINGS

FIG. 1 is a perspective view of a preferred embodiment of a cable routing apparatus made in accordance with the invention in the open position, mounted to an electronic module;

FIG. 2 is a perspective view of the cable routing apparatus of FIG. 1 mounted to a standard electronics module rack;

FIG. 3 is a top view of the mounting member of the embodiment of FIG. 1;

FIG. 4 is an end view of the mounting member of FIG. 3;

FIG. 5 is a top view of the slide member of the embodiment of FIG. 1;

FIG. 6 is a perspective view of the embodiment of FIG. 1 in the closed position; and FIG. 7 is a sectional view taken along line 7—7 of FIG. 6.

DETAILED DESCRIPTION OF THE PRESENTLY PREFERRED EMBODIMENTS

Referring to FIGS. 1–6, a preferred embodiment of the cable routing apparatus 10 includes a mounting member 12 including at least one retaining member 14, 15 for slidably receiving slide member 16. The slide member 16 is slidably attached to the mounting member 12 and the slide member 16 includes a cable opening 17 formed therein for retaining cable 50. The cable routing apparatus 10 may be operated by sliding the slide member 16 to an open position and positioning one or more cables in the cable opening 17.

In the embodiment shown in FIGS. 1–6, the mounting member 12 is designed to be mounted to one or both sides of an electronic module 18 and to an electronic module cabinet or rack 60. This provides the user, who would otherwise require a separate cable routing device and a separate mounting bracket, with a single device to perform both functions. As shown in FIGS. 3 and 4, the mounting member 12 is preferably a modified bracket including a module mounting portion 22 and rack mounting portion 24. In the embodiment shown, the module mounting portion 22 is oriented at substantially a right angle to the rack mounting portion 24. The mounting member 12 and the slide member 16 may be preferably made of any rigid material including metal or plastic. In the embodiment shown, for example, the mounting member 12 and slide member 16 may be preferably made of cold rolled steel.

Referring to FIGS. 1 and 3, the module mounting portion 22 may include openings 25–28, which may be selectively positioned for mounting on various sized and configured modules 18 and sized to receive conventional fasteners. The number and size of openings necessary may vary with module configurations. For 1the embodiment shown, the openings 25–28 have a diameter of 0.196 inches. Alternatively, other conventional means may be used to secure the mounting member 12 to the module 18 including, for example, adhesive or Velcro. For the embodiment shown, the module mounting portion 22 may have a length L of 3.46 inches, a width W of 2.0 inches and a thickness of 0.074 inches. The length of both the module mounting portion 22 and rack mounting portion may preferably be the same. The length of the mounting member 12 may preferably have a length of 1U, 2U or 3U (wherein U equals 1.75 inches), for use on standard height 43U racks 60. In some applications, for example when a 1U length is used, it may be necessary to cut away a portion of the side portion to allow for fasteners to be inserted through openings formed in the module mounting portion 22. The mounting member 12 may alternatively may have any sized length, for example, which fits on the upright support frame of a rack 60. For these extended length mounting members, multiple retaining members and slide members may be space along the length of the mounting member.

The module mounting portion 22 may also include retaining members 14, 15. The retaining members 14, 15 may preferably be formed from cut out regions of the module mounting portion 22, which creates openings 34, 35. As shown in FIG. 4, the retaining members 14, 15 are preferably L-shaped members. The retaining members 14, 15 may alternatively be separate members made of any rigid material which are attached by any conventional fastening means to the mounting member 12.

Referring to FIGS. 1 and 4, the rack mounting portion 24 of the mounting member 12 preferably includes openings 29, 30. For the embodiment shown, the rack mounting portion 24 may have a length X of 3.46 inches, a width Y of 1.0 inch, and a thickness of 0.74 inches. For the embodiment shown, the openings 29, 30 are preferably oval-shaped, and may have a length of 0.375 inches and a radius of 0.133 inches. The openings 29, 30 may be aligned with a series of standardized openings 61 in the upright support frame 62 of the rack 60, and then attached with fasteners inserted through the aligned openings. A longitudinally oriented opening 36 is also preferably formed through the rack mounting portion 24, in a region preferably adjacent the module mounting portion 22. The longitudinally oriented opening 36 may preferably have a length and width sized to receive slide members of varying shapes and sizes. For the embodiment shown, the longitudinally oriented opening 36, for example, may have a length of 1.342 inches and a width of 0.130 inch, which will allow slide member 16 to slidably fit therein. The rack mounting portion 24 with the longitudinal opening 36 may in addition act as a retaining member, and the retaining members 14, 15 may be unnecessary.

As shown in FIGS. 1 and 5, in a preferred embodiment, the slide member 16 may have a length A of 4.0 inches, a width B of 1.332 inches, and a thickness of 0.125 inch. The slide member 16 preferably includes a slot 38 formed in a body portion 41 of the slide member 16. For the embodiment shown, the slot 38 has a length of about 1.625 inches and a width of 0.144 inch. A conventional fastener 39, including, for example, a screw or rivet preferably fits through the slot 38 and is fixedly attached to the mounting member 12. In some applications, the fastener may be used as a retaining member. Preferably, the fastener 39 may be as shown in FIG. 7, a spring-loaded rivet, which provides adequate friction force to hold the slide member 16 in a desired position. The fastener 39 also acts as a stop to restrict the distance the slide member 16 extends to the fully open position shown in FIG. 1, and the distance the slide member 16 retracts to the closed position as shown in FIG. 6. As shown in FIG. 7, the spring-loaded rivet 39 may include a standard rivet 70 with a washer 71 having a diameter greater than the width of the slot 38, and a compression spring 72 to force the washer against the slide member 16, creating the friction force to hold the slide member 16 in a desired position. Alternatively other conventional fasteners, including, for example, a screw may be used to slidably attach the slide member 16 to the mounting member 12. These fasteners may or may not provide the desired friction force to hold the slide in a desired position, which may be accomplished by other means. For example, the longitudinal opening 36 may be downsized to provide the desired friction force. The retaining members 14, 15 may also be positioned to provide an increased friction force between the retaining members and the slide member 16, or be made of a material that provides sufficient friction to maintain the slide member 16 in a desired position.

It may also, for some applications, be unnecessary to provide a rivet or other fastener. For example, the stop function of the rivet 39 may be accomplished with hook portions 51, 52 formed on end portions 45, 46 of the slide member 16, and a widened back end 76 of the slide member 16, which prevents the slide member from sliding through the retaining members 14, 15 and/or the longitudinal opening 36. In such an embodiment, the friction function of the spring-loaded rivet 39 may be accomplished by various methods as one skilled in the art would recognize, including those discussed above. For some applications, a friction force sufficient to prevent the slide member 16 from freely sliding may not be necessary.

The slide member 16 also preferably is configured to provide cable opening 17, which for the embodiment shown, includes a cable retaining opening 42 and a cable insertion opening 44. The cable insertion opening 44, for the embodiment shown, may be a channel bordered by end portions 45, 46. For the embodiment of FIG. 5, the end portions 45, 46 may have a length G of 0.575 inches and a width H of 0.50 inches, and are spaced 0.332 inches apart. The cable retaining opening 42 may be bordered by arm portions 47, 48 and the inward end 49 of the end portions 45, 46. For the embodiment shown, the arm portions 47, 48 may have a length of 1.425 inches and a width of 0.20 inch. The inward ends 49 of the end portions 45, 46 help retain cables which are inserted through the cable insertion opening 44. Multiple cables 50 may be retained within the cable retaining opening 42. Hook portions 51, 52 may extend at an angle from the end portions 45, 46 to allow the slide member 16 to be easily pulled or pushed to a desired position. Other means which may allow a user to more easily grasp the slide member 16 may alternatively be used, including, for example, any of a number of various shaped rubber or textured end pieces to provide an easy grip.

Although shown as a bracket in the embodiment shown, the mounting member 12 may include, for some applications, only a flat module mounting portion 22 with retaining members 14, 15. The arm portions 47, 48 of the slide member 16 may be alternatively made of a flexible material, and the channel between the end portions 45, 46 may be partially or completely eliminated. In such a configuration, the arm portions 47, 48 may be flexed open by the user and the cable 50 inserted. When released, the end portions 45 46 would return to the closed position to retain the cable. Various other configurations of the arm portions 47, 48 may similarly be used, including, for example, flexible arms which fasten or clasp together. In some applications, it may not be necessary to include both arm portions 47, 48 and, for example, a bottom arm portion may be sufficient.

The symmetrical dual arm design, in the embodiment shown, is preferred because it allows the cable routing apparatus 10 to be mounted on either side of the module and rack. In addition, as shown in FIGS. 1 and 2, the arm portion 48, which is positioned above arm portion 47 may aid in routing the cables 50 upward along the upright support frame 62 of the rack 60.

Referring to FIGS. 1–6, once the cable routing apparatus 10 is fastened to the rack 60 and/or module 18, the user may grasp the hook portions 51, 52 of the slide member 16 and pull the slide member to the open position as shown in FIG. 1. Depending on the number of cables 50, the user may extend the slide member 16 outward as necessary to provide sufficient space between the inward end 49 of the end portions 45, 46 and the rack mounting portion 24. Alternatively, the user may extend the slide member 16 outward to the full open position, where the rivet 39 is positioned adjacent the back end 76 of the slide member 16, and then, once the cables 50 are positioned in the cable retaining opening 42, push the slide member 16 back to a partial open position. The spring-loaded rivet 39 provides a sufficient friction force between the slide member 16 and the mounting member 12 to maintain the slide member in a desired position both during insertion of the cables 50 and routing of the cables along the upright support frame 62 of the rack 60. Cables 50 may then be inserted through the cable insertion opening 44 and into the cable retaining opening 42. When the cable routing apparatus 10 is not in use, the slide member 16 may be pushed to the closed position as shown in FIG. 6.

While the embodiments of the invention disclosed herein are presently considered to be preferred, various changes and modifications can be made without departing from the spirit and scope of the invention. The scope of the invention is indicated in the appended claims, and all changes that come within that meaning and range of equivalents are intended to be embraced therein.

I claim:

1. An apparatus for routing cable comprising:

a mounting member including at least one retaining member for slidably receiving a slide member, the slide member being slidably attached to the mounting member and the slide member including a cable opening formed therein for retaining cables, the slide member includes a body portion and at least one arm portion, the body portion of the slide member includes a slot formed therein, a rivet being fitted through the slot and slidably attaching the slide member to the mounting member.

2. An apparatus for routing cables comprising:

a mounting member including a rack mounting portion and a module mounting portion, a slide member being slidably attached to the module mounting portion, the rack mounting portion including an opening formed therein for receiving the slide member, the slide member including a cable opening formed therein for receiving and retaining cables.

3. The apparatus of claim 2 wherein the rack mounting portion is oriented at substantially a right angle to the module mounting portion.

4. The apparatus of claim 2 wherein the slide member includes a body portion and at least one arm portion.

5. The apparatus of claim 4 wherein the body portion of the slide member includes a slot formed therein for receiving a rivet to allow the slide member to slide to an open position and to a closed position.

6. The apparatus of claim 4 wherein the slide member includes two arm portions.

7. The apparatus of claim 6 wherein the arm portions are symmetrical to allow the apparatus to be mounted on either side of a module or rack.

8. The apparatus of claim 6 wherein the slide member includes an end portion on each of the arm portions, an inward side of the end portions retaining cables positioned between the arm portions.

9. The apparatus of claim 8 further comprising hook portions extending at an angle to the end portions for allowing the slide member to be easily grasped and slid to a desired position.

10. The apparatus of claim 2 wherein the cable opening includes a cable insertion opening and a cable retaining opening.

11. The apparatus of claim 10 wherein the cable insertion opening is bordered by end portions of the slide member.

12. The apparatus of claim 2 wherein the cable opening is bordered by two arm portions of the slide member.

13. The apparatus of claim 12 wherein the arm portions comprise a flexible material to allow a user to flex the arm portions to insert cables into the cable opening.

* * * * *